(12) United States Patent
Hsu

(10) Patent No.: US 12,396,377 B2
(45) Date of Patent: Aug. 19, 2025

(54) METHOD FOR FORMING A SEMICONDUCTOR MEMORY DEVICE

(71) Applicant: UNITED MICROELECTRONICS CORP., Hsin-Chu (TW)

(72) Inventor: Chia-Ching Hsu, Singapore (SG)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 18/635,027

(22) Filed: Apr. 15, 2024

(65) Prior Publication Data

US 2024/0260489 A1    Aug. 1, 2024

Related U.S. Application Data

(62) Division of application No. 17/229,873, filed on Apr. 14, 2021, now Pat. No. 12,133,479.

(30) Foreign Application Priority Data

Mar. 25, 2021   (CN) .......................... 202110320383.0

(51) Int. Cl.
H10N 70/20      (2023.01)
H10N 70/00      (2023.01)

(52) U.S. Cl.
CPC ....... *H10N 70/8265* (2023.02); *H10N 70/021* (2023.02); *H10N 70/245* (2023.02); *H10N 70/841* (2023.02); *H10N 70/8833* (2023.02)

(58) Field of Classification Search
CPC . H10N 70/823; H10N 70/8833; H10N 70/841
See application file for complete search history.

(56) References Cited

U.S. PATENT DOCUMENTS 9,099,645 B2   8/2015  Miyagawa
9,564,587 B1   2/2017  Jo
(Continued)

FOREIGN PATENT DOCUMENTS

CN    106299110 A    1/2017
CN    110875353 A    3/2020
(Continued)

OTHER PUBLICATIONS

Li, Y. et al., An Overview of Resistive Switching Non-Volatile Memory. Chinese Sci Bull, vol. 56, Issue 24, 2011, Science China Press, pp. 1967-1973, Aug. 2011.
(Continued)

*Primary Examiner* — Mark V Prenty
(74) *Attorney, Agent, or Firm* — Winston Hsu

(57) ABSTRACT

A semiconductor memory device includes a substrate, a first dielectric layer on the substrate, a bottom electrode on the first dielectric layer, a second dielectric layer on the first dielectric layer, and a top electrode in the second dielectric layer. The top electrode has a lower portion around the bottom electrode and a tapered upper portion. A third dielectric layer is disposed above the bottom electrode and around the tapered upper portion of the top electrode. A resistive-switching layer is disposed between a sidewall of the bottom electrode and a sidewall of the lower portion of the top electrode and between the third dielectric layer and a sidewall of the tapered upper portion of the top electrode. An air gap is disposed in the third dielectric layer.

10 Claims, 11 Drawing Sheets

(56) References Cited

U.S. PATENT DOCUMENTS

| | | |
|---|---|---|
| 10,658,582 B2 | 5/2020 | Ando |
| 12,133,479 B2 * | 10/2024 | Hsu ..................... H10N 70/021 |
| 2018/0019390 A1 | 1/2018 | Chen |
| 2019/0044065 A1 | 2/2019 | Tseng |
| 2019/0074440 A1 | 3/2019 | Yang |
| 2020/0328346 A1 | 10/2020 | Kong |
| 2020/0365799 A1 | 11/2020 | Lee |
| 2022/0310910 A1 | 9/2022 | Hsu |

FOREIGN PATENT DOCUMENTS

| | | |
|---|---|---|
| CN | 111092152 A | 5/2020 |
| CN | 111435662 A | 7/2020 |
| WO | 2018/022027 A1 | 2/2018 |

OTHER PUBLICATIONS

Urigga, The Study of Three-Dimensional (3D) Vertical Resistive Switching Memory: Characteristics, Mechanisms and Integration, China Excellent Master's Thesis Full-text Database Information Technology, Issue 12, https://www.cnki.net, May 3, 2015.

* cited by examiner

METHOD FOR FORMING A SEMICONDUCTOR MEMORY DEVICE

CROSS REFERENCE TO RELATED APPLICATIONS

This application is a division of U.S. application Ser. No. 17/229,873, filed on Apr. 14, 2021. The content of the application is incorporated herein by reference.

BACKGROUND OF THE INVENTION

1. Field of the Invention

The present invention relates to the field of semiconductor technology, in particular to a resistive random access memory device (RRAM) and a manufacturing method thereof.

2. Description of the Prior Art

Resistive RAM (RRAM) is a general name for two-terminal reprogrammable devices that can be set to either a low or high resistance state. RRAM generally consists of a dielectric layer disposed between two electrodes. Some types of RRAM conduct by forming a distinct filament in a limited area of the dielectric. Other types of RRAM conduct by changing the properties of the dielectric throughout its area.

RRAM stores data by using the variable resistance characteristic of a dielectric layer interposed between two electrodes. Such dielectric layer, as a resistive layer, is normally insulating but can be made to be conductive through a filament or conduction path formed after application of a sufficiently high voltage, i.e. through a forming process. The conduction path formation can arise from different mechanisms, including defects, metal migration, etc. Once the filament is formed, it may be reset (i.e. broken, resulting in high resistance) or set (i.e. re-formed, resulting in lower resistance) by an appropriately applied voltage.

The high-density RRAM structure is usually formed in the back-end metallization process (BEOL), which leads to higher parasitic capacitance and RC delay. Therefore, there is still a need for an improved RRAM structure in this technical field, which can improve the parasitic capacitance problem.

SUMMARY OF THE INVENTION

It is one object of the present invention to provide a semiconductor storage device and a manufacturing method thereof to solve the above-mentioned drawbacks or shortcomings of the prior art.

One aspect of the invention provides a semiconductor memory device including a substrate, a first dielectric layer on the substrate, a bottom electrode on the first dielectric layer, a second dielectric layer on the first dielectric layer, and a top electrode in the second dielectric layer. The top electrode comprises a lower portion around the bottom electrode and a tapered upper portion. A third dielectric layer is disposed above the bottom electrode and around the tapered upper portion of the top electrode. A resistive-switching layer is disposed between a sidewall of the bottom electrode and a sidewall of the lower portion of the top electrode and between the third dielectric layer and a sidewall of the tapered upper portion of the top electrode. An air gap is disposed in the third dielectric layer.

According to some embodiments, the semiconductor memory device further includes a dielectric block layer between the second dielectric layer and the first dielectric layer.

According to some embodiments, the top electrode is disposed on the dielectric block layer.

According to some embodiments, the resistive-switching layer includes $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$, wherein x>0, y>0.

According to some embodiments, the top electrode includes TiN, TaN or Pt.

According to some embodiments, a top surface of the second dielectric layer is coplanar with a top surface of the top electrode.

According to some embodiments, the semiconductor memory device further includes a metal layer disposed in the third dielectric layer and electrically connected to the top electrode.

According to some embodiments, a top surface of the third dielectric layer is coplanar with a top surface of the top electrode and a top surface of the second dielectric layer.

According to some embodiments, the semiconductor memory device further includes a capping layer covering the second dielectric layer, the top electrode and the third dielectric layer, a fourth dielectric layer on the capping layer, and a conductive via disposed in the fourth dielectric layer and electrically connected to the top electrode.

According to some embodiments, a thickness of the tapered upper portion of the top electrode is greater than a thickness of the lower portion of the top electrode.

Another aspect of the invention provides a method for forming a semiconductor memory device. A substrate is provided. A first dielectric layer is formed on the substrate. A first conductive layer is deposited on the first dielectric layer. A hard mask layer is deposited on the first conductive layer. The first conductive layer is patterned into a bottom electrode by forming a first opening in the hard mask layer and the first conductive layer. A second dielectric layer is deposited in the first opening and on the hard mask layer and the first dielectric layer. The second dielectric layer is polished to expose a top surface of the hard mask layer. The second dielectric layer is patterned by etching the second dielectric layer, thereby forming a second opening in the second dielectric layer. The second opening comprises a lower portion and a tapered upper portion. A resistive-switching layer is deposited in the second opening. A second conductive layer is deposited on the resistive-switching layer and in the second opening. The second conductive layer and the resistive-switching layer are polished until the top surface of the hard mask layer is exposed, thereby forming a top electrode in the second opening. The top electrode comprises a lower portion around the bottom electrode and a tapered upper portion.

According to some embodiments, the method further includes the steps of removing the hard mask layer after polishing the second conductive layer and the resistive-switching layer, thereby forming a third opening on the bottom electrode; and depositing a third dielectric layer into the third opening, thereby forming an air gap in the third dielectric layer on the bottom electrode and around the upper portion of the top electrode.

According to some embodiments, the third dielectric layer covers the top electrode and the second dielectric layer.

According to some embodiments, the method further includes the step of forming a metal layer in the third dielectric layer, wherein the metal layer is electrically connected to the top electrode.

According to some embodiments, the method further includes the step of polishing the third dielectric layer until a top surface of the third dielectric layer is coplanar with a top surface of the top electrode and a top surface of the second dielectric layer.

According to some embodiments, the method further includes the steps of forming a capping layer covering the second dielectric layer, the top electrode and the third dielectric layer; forming a fourth dielectric layer on the capping layer; and forming a conductive via in the fourth dielectric layer, wherein the conductive via is electrically connected to the top electrode.

According to some embodiments, the resistive-switching layer is disposed between a sidewall of the bottom electrode and a sidewall of the lower portion of the top electrode and between the third dielectric layer and a sidewall of the tapered upper portion of the top electrode.

According to some embodiments, the method further includes the step of forming a dielectric block layer between the second dielectric layer and the first dielectric layer.

According to some embodiments, the top electrode is disposed on the dielectric block layer.

According to some embodiments, the resistive-switching layer comprises $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$, where x>0, y>0.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 4 to FIG. 19 are schematic diagrams showing a method of forming a semiconductor memory device according to an embodiment of the present invention, wherein FIG. 8 shows the top view of the semiconductor memory device after the patterning of the bottom electrode is completed, FIG. 9 is a cross-sectional view taken along line II-II' in FIG. 8, FIG. 12 shows the top view of the semiconductor memory device after the formation of openings for the predetermined top electrodes, FIG. 13 is a cross-sectional view taken along line II-II' in FIG. 12, FIG. 17 shows the top view of the semiconductor memory device after the formation of an air gap on the bottom electrode, and FIG. 18 is a cross-sectional view taken along line II-II' in FIG. 17.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized and structural, logical, and electrical changes may be made without departing from the scope of the present invention. Therefore, the following detailed description is not to be considered as limiting, but the embodiments included herein are defined by the scope of the accompanying claims.

Figure 1:
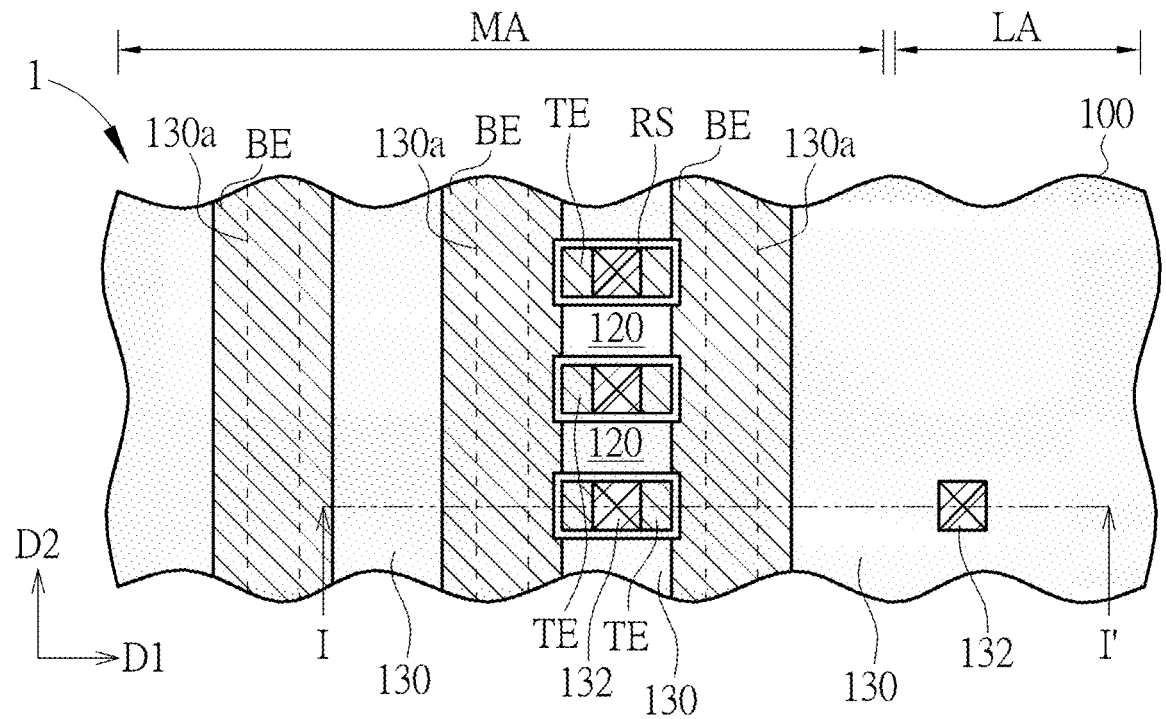
FIG. 1 is a top view of a part of a semiconductor memory device according to an embodiment of the present invention.
Figure 2:
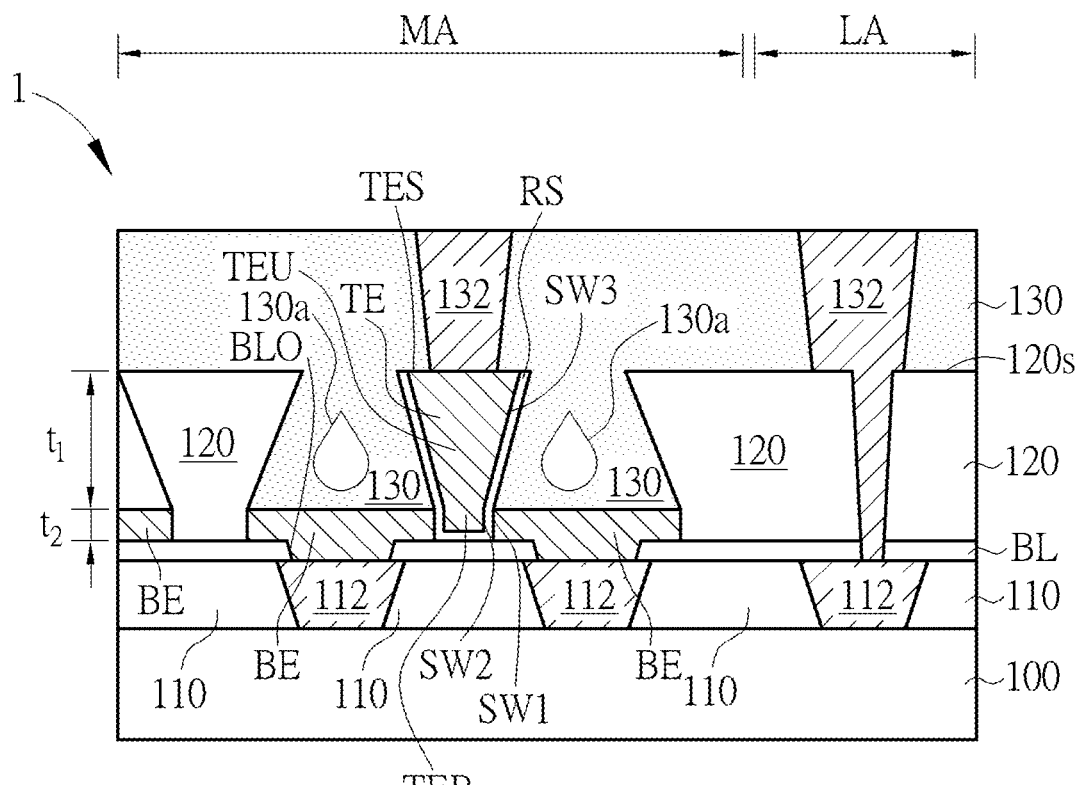
FIG. 2 is a cross-sectional view taken along the line I-I' in FIG. 1.

Please refer to FIG. 1 and FIG. 2. FIG. 1 is a top view of a part of a semiconductor memory device according to an embodiment of the present invention, and FIG. 2 is a cross-sectional view taken along the line I-I' in FIG. 1. As shown in FIG. 1 and FIG. 2, the semiconductor memory device 1 includes a substrate 100, such as a semiconductor substrate, but is not limited thereto. The substrate 100 may include a memory array area MA and a logic circuit area LA. The semiconductor memory device 1 further includes a first dielectric layer 110 on the substrate 100 and covering the memory array area MA and the logic circuit area LA. According to an embodiment of the present invention, the first dielectric layer 110 may include a silicon oxide layer, but is not limited thereto. According to an embodiment of the present invention, a metal layer 112, such as a copper metal layer, but is not limited thereto, may be formed in the first dielectric layer 110. According to the embodiment of the present invention, for example, the metal layer 112 may be the third metal layer (M3) in the metal interconnection structure, but is not limited thereto. According to an embodiment of the present invention, a dielectric barrier layer BL, such as a silicon nitride layer, may be formed on the first dielectric layer 110. A plurality of openings BLO may be formed in the dielectric barrier layer BL, which respectively expose the top surfaces of the corresponding metal layers 112.

According to an embodiment of the present invention, in the memory array area MA, a plurality of bottom electrodes BE may be formed on the dielectric barrier layer BL and the first dielectric layer 110. As shown in FIG. 1, the bottom electrodes BE are arranged approximately equidistantly in a first direction D1 and extend along the second direction D2. For the sake of simplify, only three bottom electrodes BE are exemplarily shown in FIG. 1 and FIG. 2. As shown in FIG. 2, the plurality of bottom electrodes BE may be electrically connected to the metal layers 112 in the first dielectric layer 110 through a plurality of openings BLO, respectively. According to an embodiment of the present invention, for example, the bottom electrodes BE may comprise TiN or TaN, but is not limited thereto.

As shown in FIG. 2, the semiconductor memory device 1 further includes a second dielectric layer 120 on the dielectric barrier layer BL and the first dielectric layer 110. The dielectric barrier layer BL is located between the second dielectric layer 120 and the first dielectric layer 110. According to an embodiment of the present invention, the second dielectric layer 120 may include a silicon oxide layer, but is not limited thereto.

According to an embodiment of the present invention, on the dielectric barrier layer BL and between the bottom electrode BE in the middle and the bottom electrode BE on the right, a plurality of top electrodes TE may be arranged at intervals along the second direction D2. According to an embodiment of the present invention, the plurality of top electrodes TE may be approximately equidistantly arranged and aligned in the second direction D2. According to the embodiment of the present invention, the top electrodes TE are located in the second dielectric layer 120. As shown in FIG. 1, in the second direction D2, the second dielectric layer 120 is disposed between the top electrodes TE.

According to an embodiment of the present invention, each of the top electrodes TE includes a lower portion TEB and a tapered upper portion TEU. The lower portion TEB is located around the bottom electrode BE. The tapered upper portion TEU of the top electrode TE gradually decreases in width from top to bottom, and is connected to the lower TEB with approximately the same width. According to an embodiment of the present invention, the thickness $t_1$ of the tapered upper portion TEU of the top electrode TE is greater than the thickness $t_2$ of the lower portion TEB of the top electrode TE. According to an embodiment of the present invention, the top electrode TE may include TiN, TaN, or Pt, but is not limited thereto. According to an embodiment of the present invention, the top surface 120s of the second dielectric layer 120 is flush with the top surface TES of the top electrode TE.

As shown in FIG. 2, the semiconductor memory device 1 further includes a third dielectric layer 130 located above the bottom electrodes BE and surrounding the tapered upper portion TEU of each top electrode TE and above the second dielectric layer 120. The semiconductor memory device 1 further includes an air gap 130a located in the third dielectric layer 130. According to an embodiment of the present invention, the air gap 130a is located around the tapered upper portion TEU of each top electrode TE and extends along the second direction D2.

According to an embodiment of the present invention, the semiconductor memory device 1 further includes a resistive-switching layer RS located between a sidewall SW1 of the bottom electrode BE and a sidewall SW2 of the lower portion TEB of the top electrode TE, and between a third dielectric layer 130 and a sidewall SW3 of the tapered upper portion TEU the top electrode TE. According to an embodiment of the present invention, the resistive-switching layer RS may comprise $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$, where x>0, y>0. According to an embodiment of the present invention, the semiconductor memory device 1 further includes a metal layer 132 disposed in the third dielectric layer 130 in the MA region and electrically connected to the top electrode TE, and in the LA region, the metal layer 132 is electrically connected to the third metal layer 112. According to an embodiment of the present invention, the metal layer 132 may be a copper metal layer. For example, a copper damascene process may be used to form the metal layer 132, but it is not limited thereto.

Figure 3:
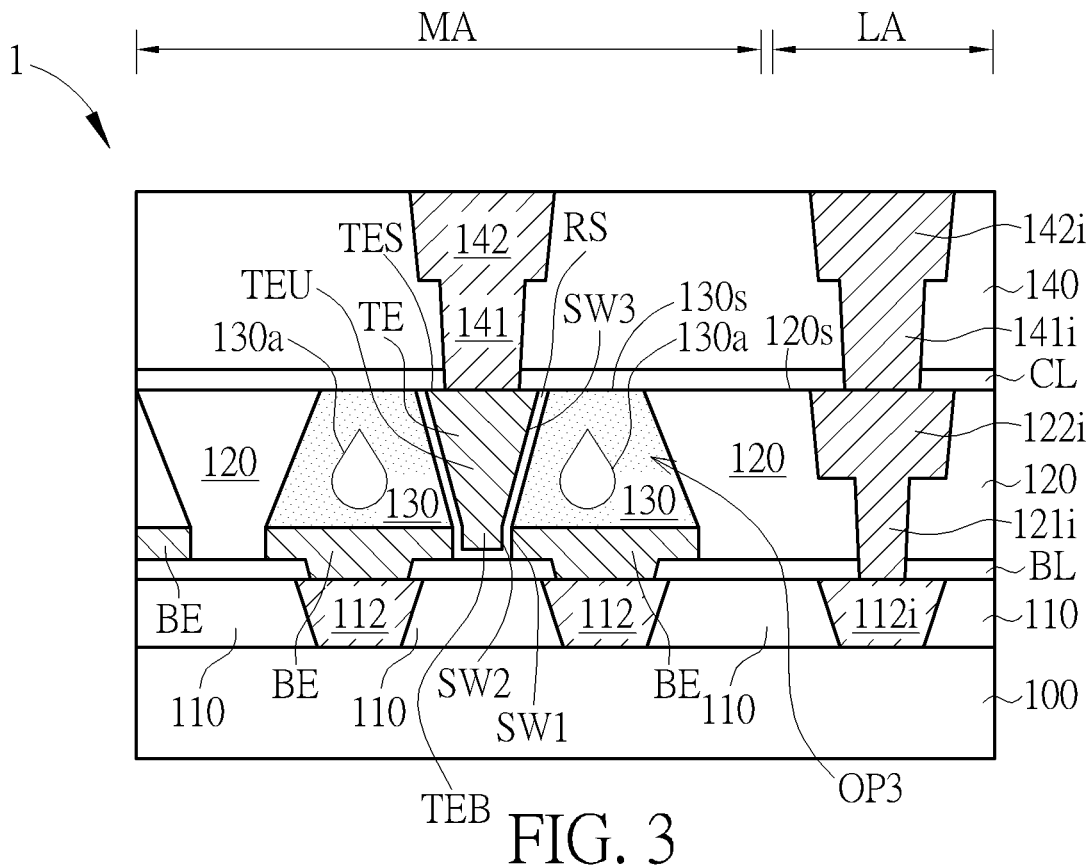
FIG. 3 is a cross-sectional diagram showing a part of a semiconductor memory device according to another embodiment of the present invention.

According to another embodiment of the present invention, as shown in FIG. 3, the top surface 130s of the third dielectric layer 130 is flush with the top surface TES of the top electrode TE and the top surface 120s of the second dielectric layer 120. The semiconductor memory device 1 further includes a capping layer CL covering the second dielectric layer 120, the top electrode TE, and the third dielectric layer 130. The semiconductor memory device 1 further includes a fourth dielectric layer 140 on the capping layer CL, and a conductive via 141 disposed in the fourth dielectric layer 140 and electrically connected to the top electrode TE. According to an embodiment of the present invention, another metal layer 142 may be disposed in the fourth dielectric layer 140, for example, a copper metal layer, but it is not limited thereto. According to the embodiment of the present invention, for example, the metal layer 142 may be the fourth metal layer (M4) in the metal interconnect structure, but is not limited thereto. A metal layer 142i and a conductive via 141i may be provided in the fourth dielectric layer 140 in the logic circuit area LA. The metal layer 142i is electrically connected to a metal layer 122i in the second dielectric layer 120 through the conductive via 141i. The metal layer 122i is electrically connected to the metal layer 112i in the first dielectric layer 110 through the conductive via 121i.

Figure 8:
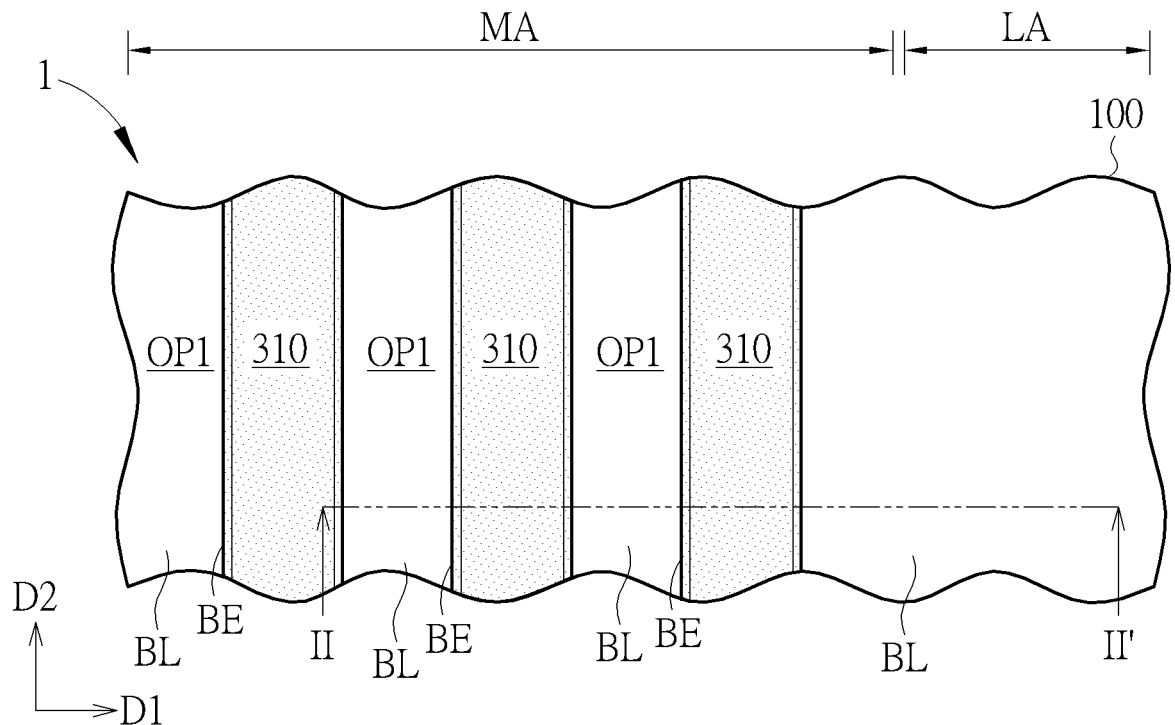
Figure 9:
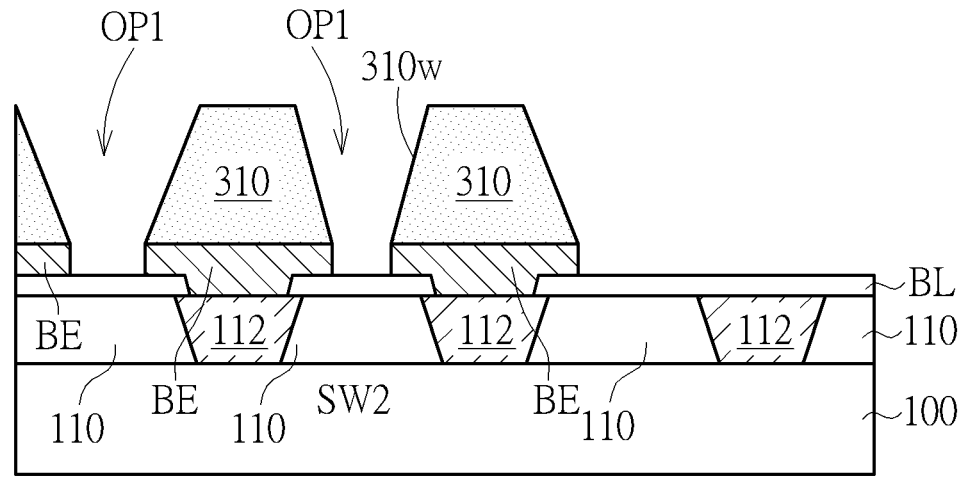
Figure 12:
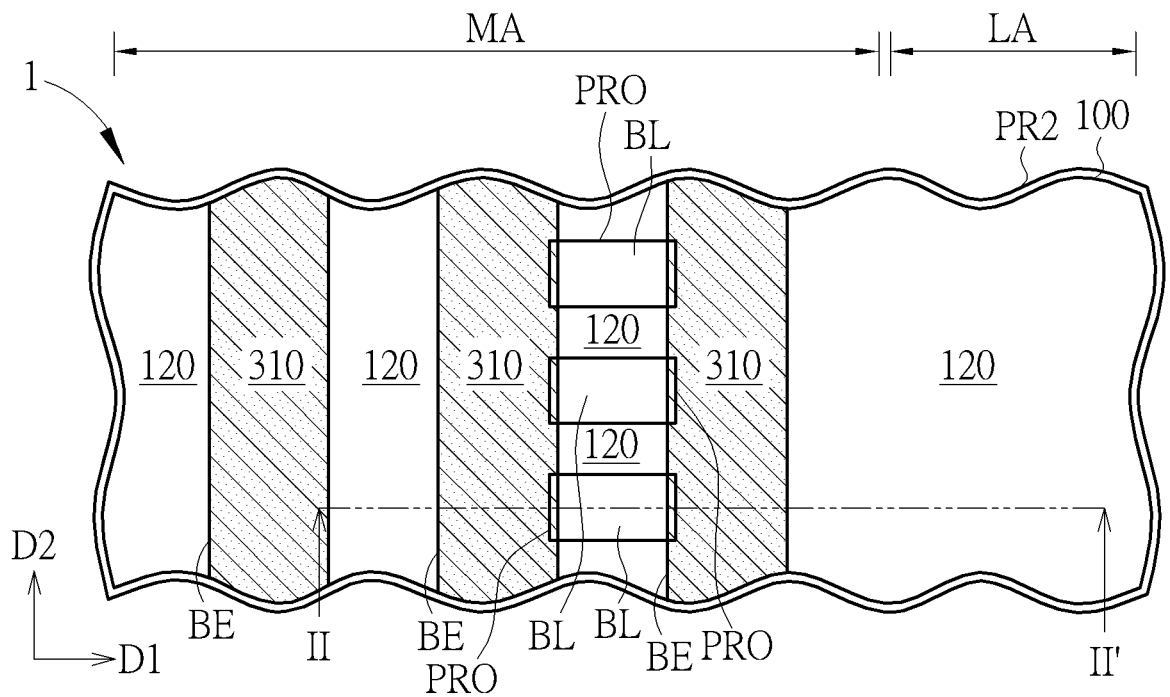
Figure 13:
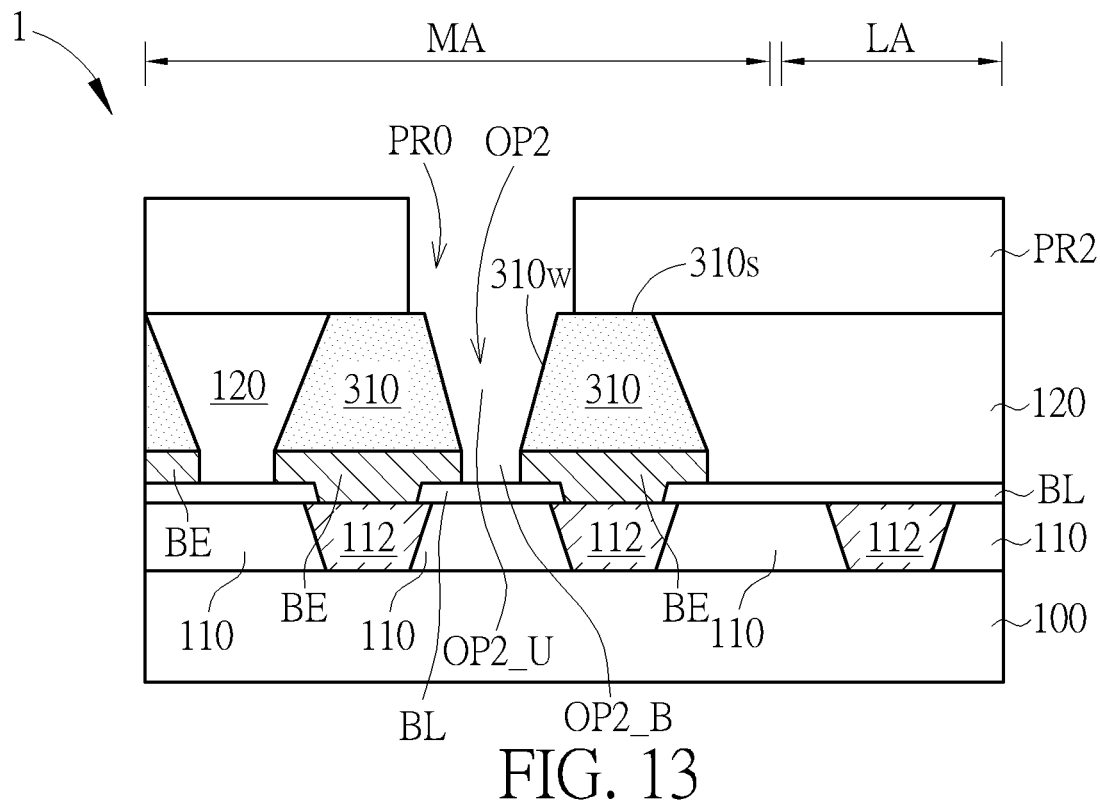
Figure 17:
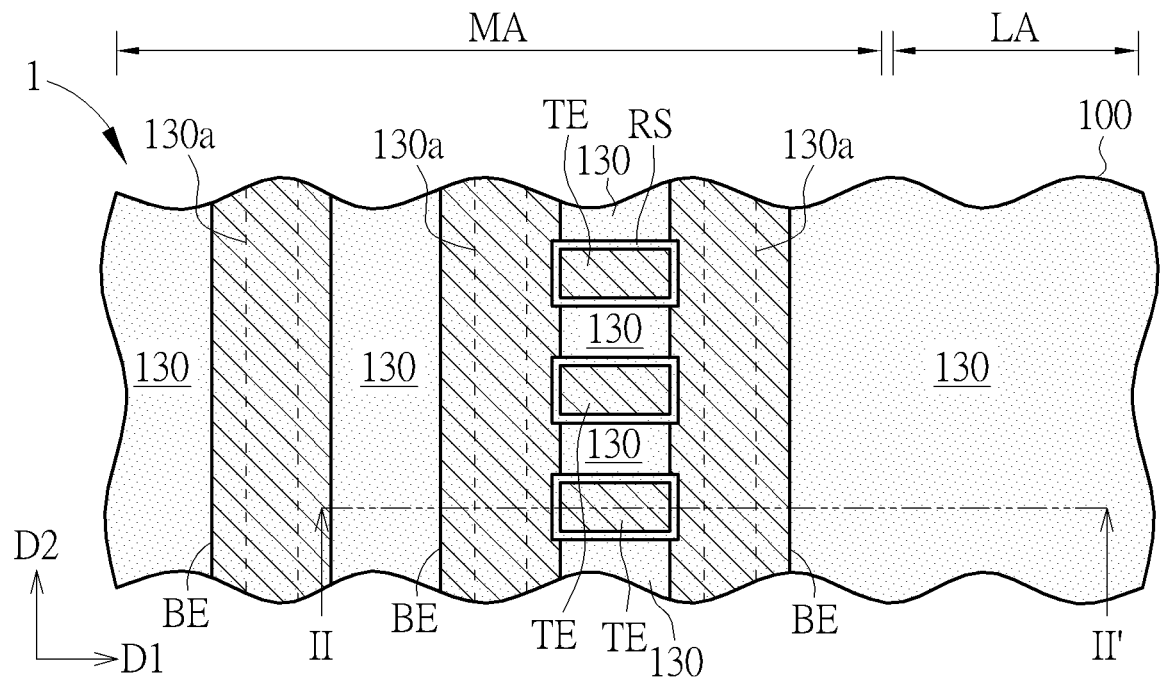
Figure 18:
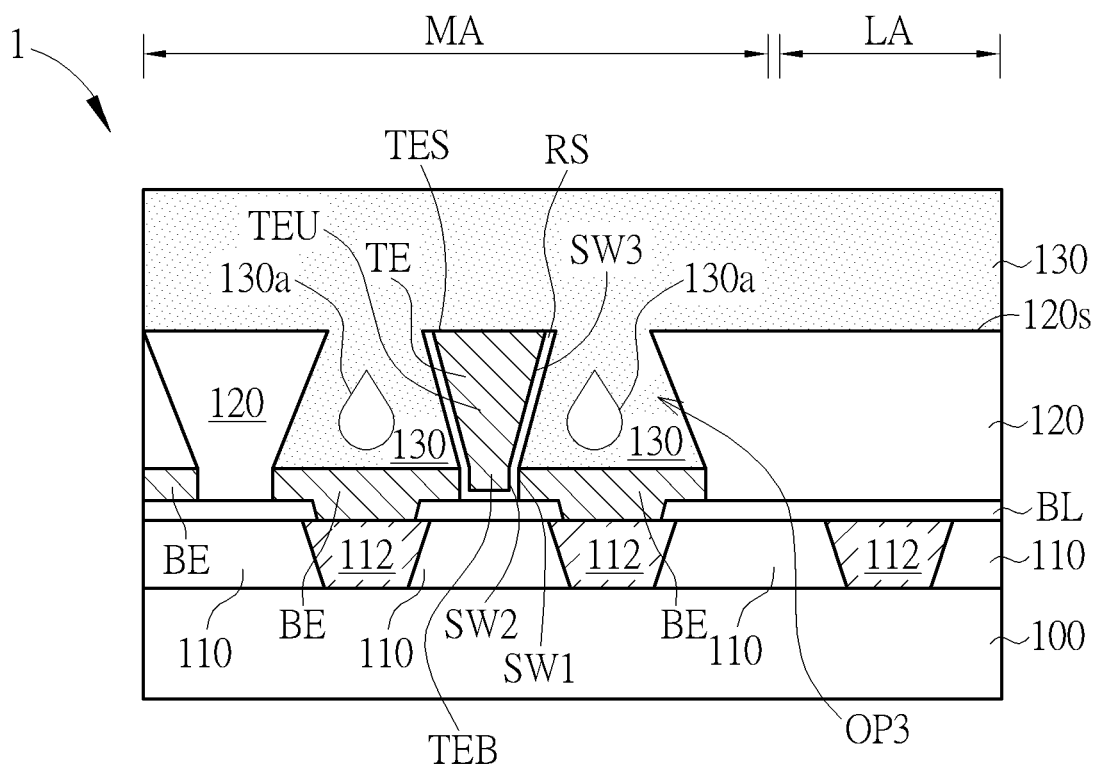

Please refer to FIG. 4 to FIG. 19, which are schematic diagrams showing a method of forming a semiconductor memory device according to an embodiment of the present invention, wherein like regions, layers or elements are designated by like numeral numbers or labels. FIG. 8 shows the top view of the semiconductor memory device after the patterning of the bottom electrode is completed. FIG. 9 is a cross-sectional view taken along line II-II' in FIG. 8. FIG. 12 shows the top view of the semiconductor memory device after the formation of openings for the predetermined top electrodes. FIG. 13 is a cross-sectional view taken along line II-II' in FIG. 12. FIG. 17 shows the top view of the semiconductor memory device after the formation of an air gap on the bottom electrode. FIG. 18 is a cross-sectional view taken along line II-II' in FIG. 17.

Figure 4:
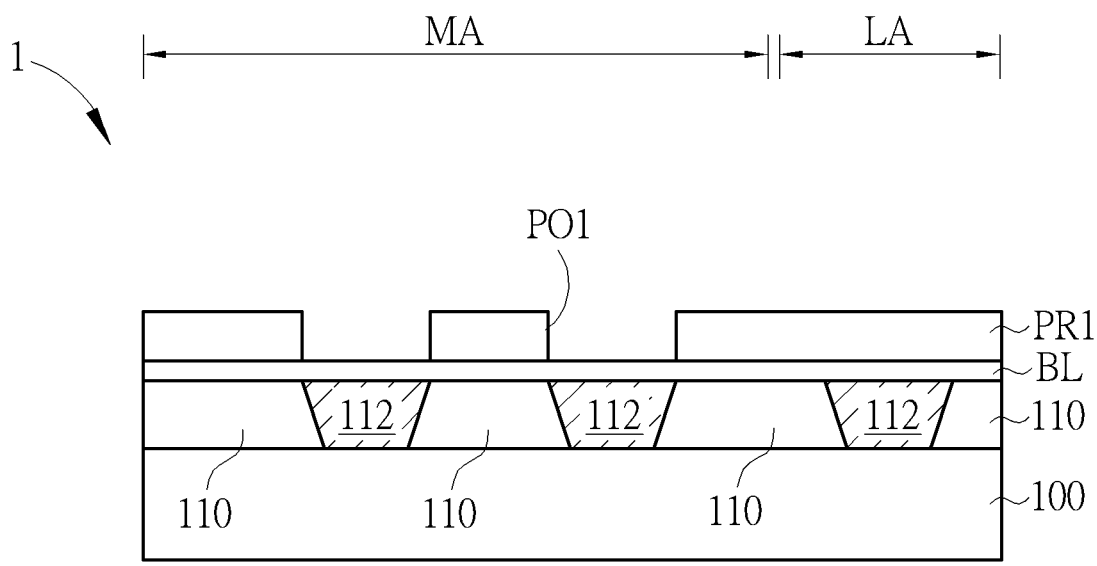

As shown in FIG. 4, a substrate 100 is provided, for example, a silicon substrate, but not limited thereto. Likewise, the substrate 100 may include a memory array area MA and a logic circuit area LA. The semiconductor memory device 1 further includes a first dielectric layer 110 deposited on the substrate 100 to cover the memory array area MA and the logic circuit area LA. According to an embodiment of the present invention, the first dielectric layer 110 may include a silicon oxide layer, but is not limited thereto.

According to an embodiment of the present invention, a metal layer 112, such as a copper metal layer, but is not limited thereto, may be formed in the first dielectric layer 110. According to the embodiment of the present invention, for example, the metal layer 112 may be the third metal layer (M3) in the metal interconnect structure, but is not limited thereto. According to an embodiment of the present invention, a dielectric barrier layer BL may be deposited on the first dielectric layer 110, for example, a silicon nitride layer. Subsequently, a photoresist pattern PR1 is formed on the dielectric barrier layer BL. The photoresist pattern PR1 includes openings PO1, which are approximately aligned with the underlying metal layers 112 in the memory array area MA.

Figure 5:
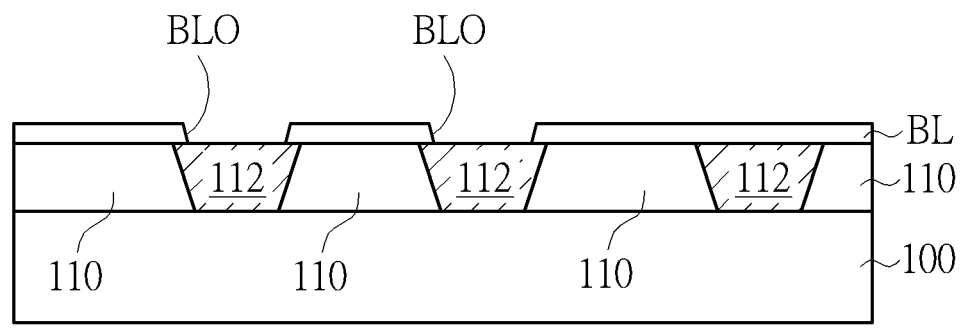

As shown in FIG. 5, an etching process is then performed by, for example, a dry etching process. The photoresist pattern PR1 is used as an etching resist layer, and the exposed dielectric barrier layer BL is etched through the openings PO1, thereby forming openings BLO in the dielectric barrier layer BL, partially exposing the metal layers 112. Then, the remaining photoresist pattern PR1 is removed.

Figure 6:
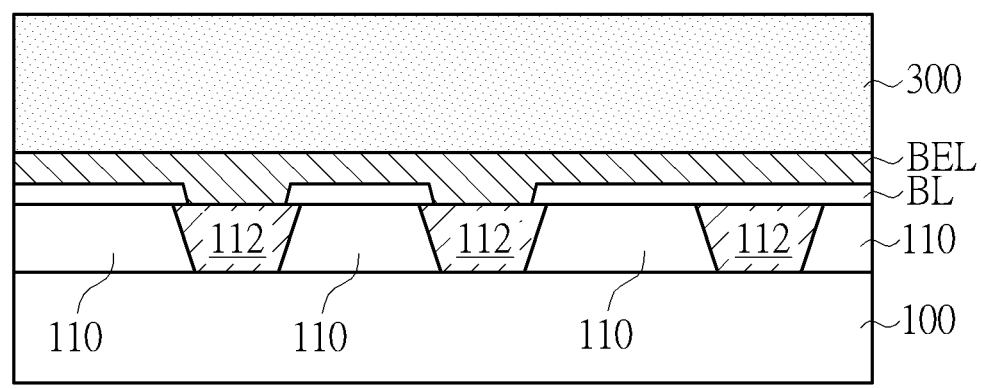

As shown in FIG. 6, a first conductive layer BEL is then deposited on the first dielectric layer 110 and the dielectric barrier layer BL. According to an embodiment of the present invention, for example, the first conductive layer BEL may include TiN or TaN, but is not limited thereto. According to an embodiment of the present invention, the first conductive layer BEL is filled in the openings BLO and directly contacts the metal layers 112. A hard mask layer 300, for example, a silicon nitride layer, is then deposited on the first conductive layer BEL.

Figure 7:
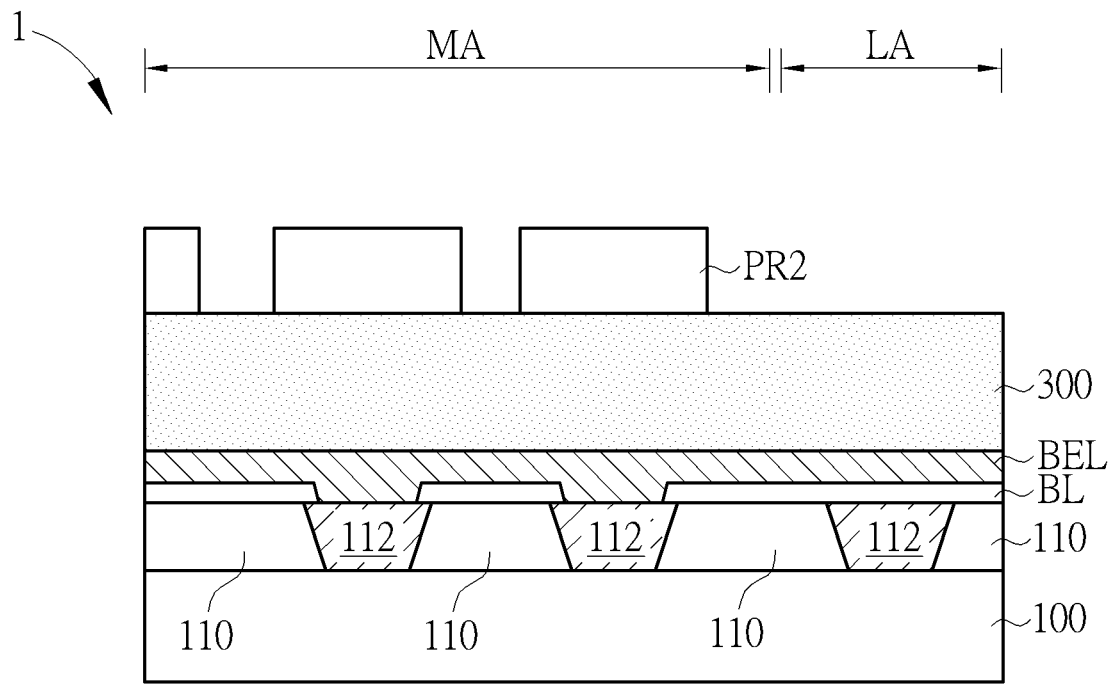

As shown in FIG. 7, subsequently, a photolithographic process is performed to form a photoresist pattern PR2 on the hard mask layer 300. The photoresist pattern PR2 defines the pattern and location of the bottom electrodes to be formed in the memory array area MA.

As shown in FIG. 8 and FIG. 9, by using the photoresist pattern PR2 as an etching resist layer, an etching process, for example, a dry etching process is then performed to etch away the exposed hard mask layer 300 and the first conductive layer BEL. First openings OP1 are formed in the hard mask layer 300 and the first conductive layer BEL, and the first conductive layer BEL is patterned into the bottom electrodes BE. A plurality of bottom electrodes BE extending along the second direction D2 and a patterned hard mask layer 310 directly above the bottom electrodes BE are formed.

According to an embodiment of the present invention, as shown in FIG. 9, because the patterned hard mask layer 310 has inclined sidewalls 310w that taper from top to bottom, the first opening OP1 has a funnel-like cross-sectional profile. At this point, the hard mask layer 310 and the first conductive layer BEL in the logic circuit area LA are completely removed, thereby exposing the dielectric barrier layer BL. The formation of the patterned hard mask layer 310 and the inclined sidewalls 310w tapering from top to bottom can be achieved by adjusting the etching parameters. As it is a well-known technique, the details will not be described.

Figure 10:
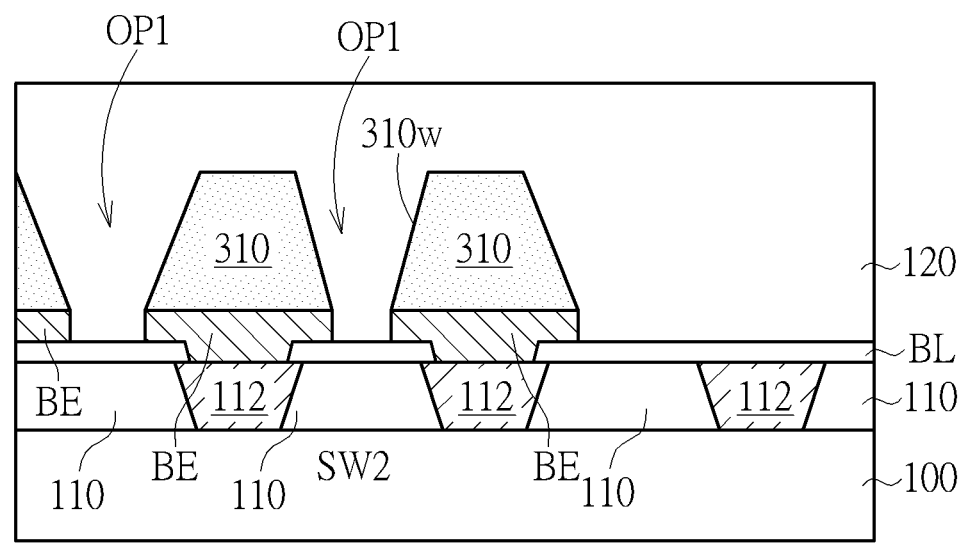

As shown in FIG. 10, subsequently, a second dielectric layer 120 is deposited on the patterned hard mask layer 310, on the dielectric barrier layer BL and the first dielectric layer 110, and in the first openings OP1. According to an embodiment of the present invention, the second dielectric layer 120 may include a silicon oxide layer, but is not limited thereto. According to an embodiment of the present invention, the second dielectric layer 120 may be formed by a method such as chemical vapor deposition (CVD), but is not limited thereto.

Figure 11:
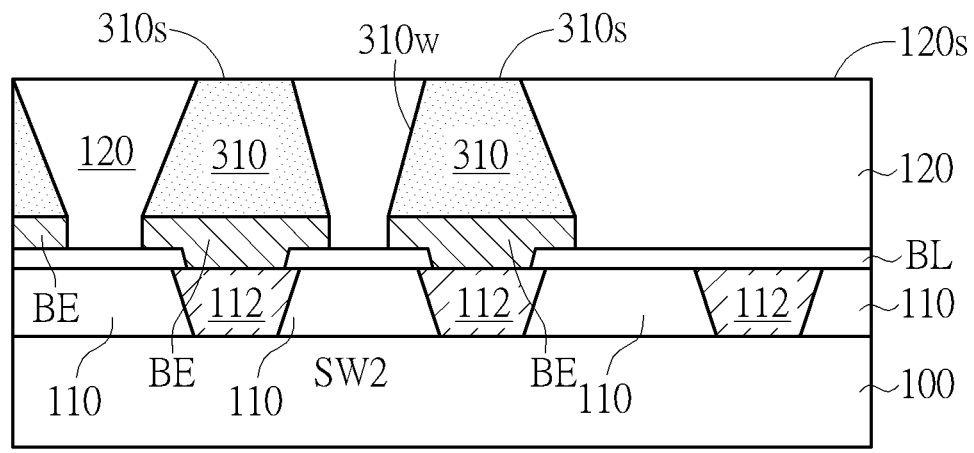

As shown in FIG. 11, the second dielectric layer 120 is subjected to a polishing process, for example, a chemical mechanical polishing (CMP) process to expose the top surface 310s of the hard mask layer 310. At this point, the top surface 310s of the hard mask layer 310 and the top surface 120s of the second dielectric layer 120 are coplanar. In other embodiments, etching can be used instead of polishing.

As shown in FIG. 12 and FIG. 13, a photolithographic process is then performed to form a photoresist pattern PR2 on the patterned hard mask layer 300. The photoresist pattern PR2 has openings PRO that define the pattern and location of the top electrodes to be formed in the memory array area MA. It can be seen from FIG. 12 that the openings PRO defining the position of the top electrodes are located between two adjacent bottom electrodes BE. The openings PRO are arranged approximately equidistantly along the second direction D2, and is slightly overlapped with the two adjacent bottom electrodes BE in the first direction D1.

Subsequently, the second dielectric layer 120 is etched through the openings PRO of the photoresist pattern PR2 to pattern the second dielectric layer 120, thereby forming second openings OP2 in the second dielectric layer 120. Each of the second openings OP2 includes a lower part OP2_B and a cone-shaped upper part OP2_U. The contour of the cone-shaped upper part OP2_U is defined by the inclined sidewall 310w of the patterned hard mask layer 310 tapering from top to bottom. The lower portion OP2_B of the second opening OP2 has an approximately constant width, and the dielectric barrier layer BL is partially exposed by the lower portion OP2_B of the second opening OP2.

Figure 14:
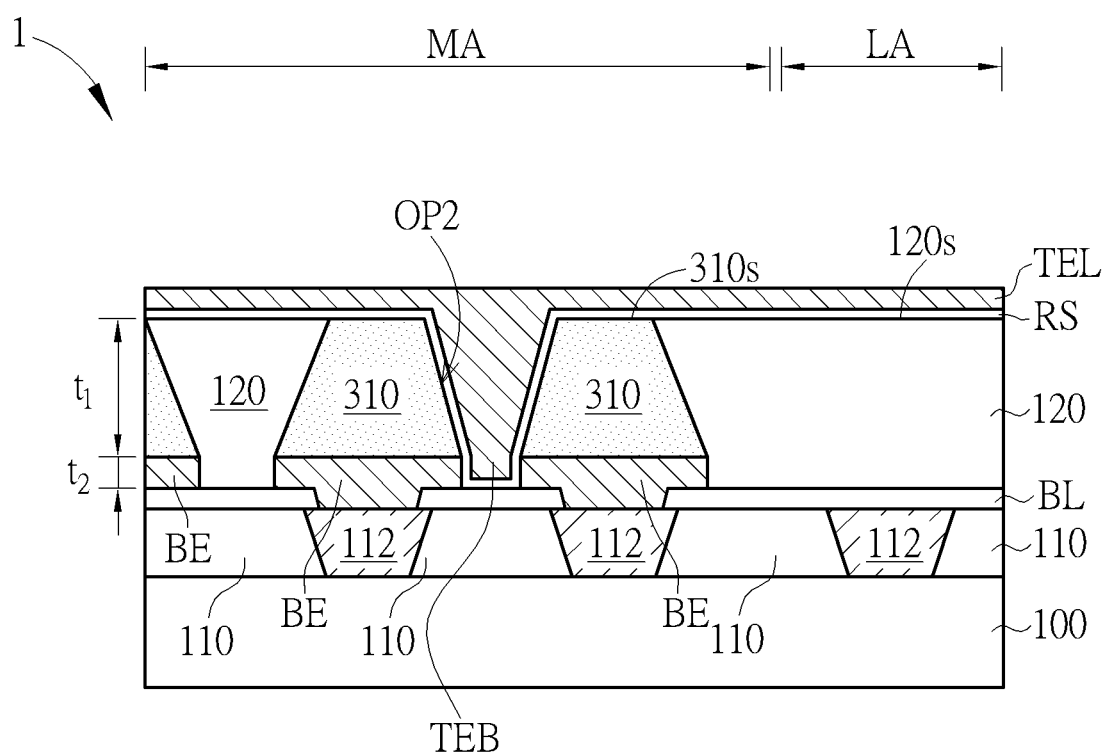

As shown in FIG. 14, next, a resistive-switching layer RS is conformally deposited in the second opening OP2 and on the top surface 310s of the patterned hard mask layer 310 and on the top surface 120s of the second dielectric layer 120. The resistive-switching layer RS is not completely filled in the second openings OP2. The resistive-switching layer RS is conformally deposited on the sidewalls and bottoms of the second openings OP2. Subsequently, a second conductive layer TEL is deposited on the resistive-switching layer RS and in the second openings OP2. According to an embodiment of the present invention, the second conductive layer TEL may include TiN, TaN, or Pt, but is not limited thereto. According to an embodiment of the present invention, the resistive-switching layer RS may include a transition metal oxide, for example, including, but not limited to, $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$, where x>0, y>0. According to an embodiment of the present invention, the second conductive layer TEL and the resistive-switching layer RS are completely filled in the second openings OP2.

Figure 15:
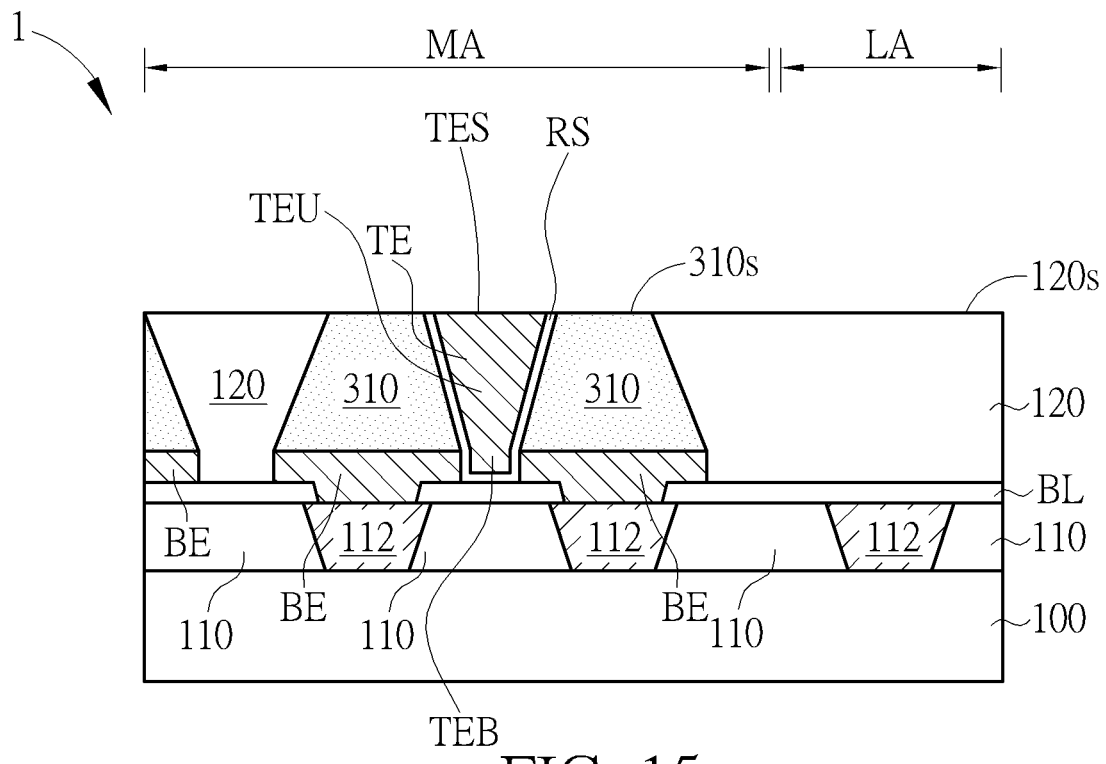

As shown in FIG. 15, the second conductive layer TEL and the resistive-switching layer RS are subjected to a polishing process, for example, a CMP process, thereby exposing the top surface 310s of the patterned hard mask layer 310 and the top surface 120s of the second dielectric layer 120 such that top electrodes TE are formed in the second openings OP2. Each of the top electrodes TE includes a lower portion TEB located around the bottom electrode BE and a tapered upper portion TEU. At this point, the top surface 310s of the patterned hard mask layer 310, the top surface 120s of the second dielectric layer 120, and the top surface TES of each top electrode TE are coplanar. In other embodiments, etching can be used instead of polishing.

Figure 16:
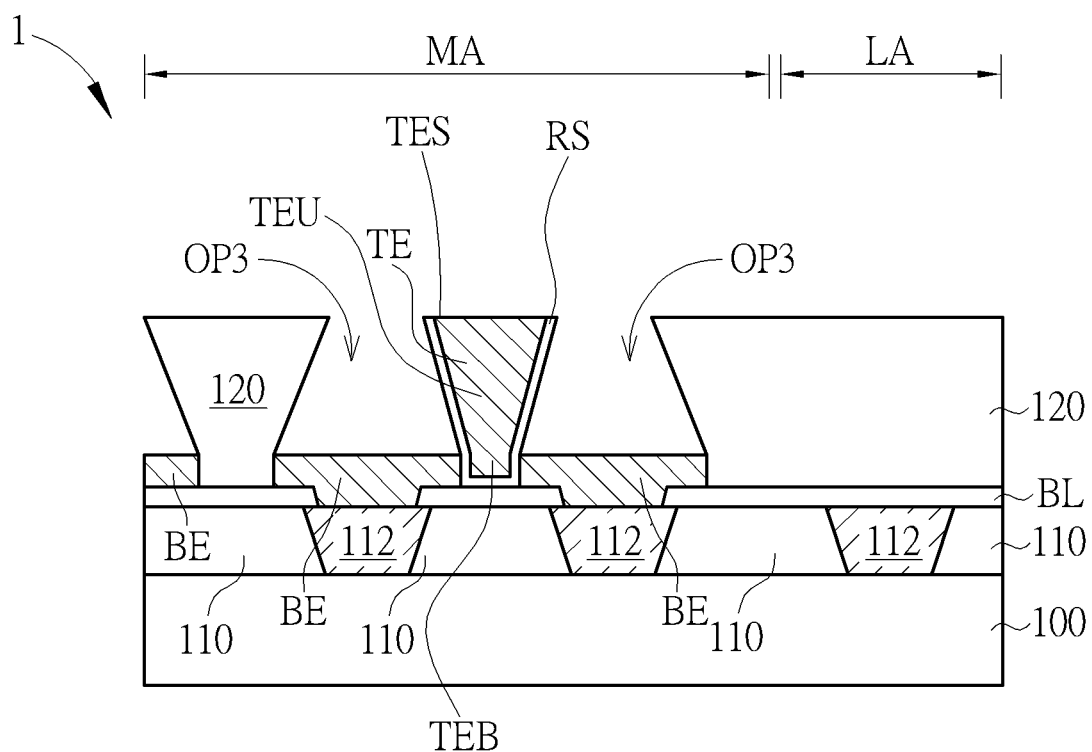

As shown in FIG. 16, after polishing the second conductive layer TEL and the resistive-switching layer RS, the patterned hard mask layer 310 is removed, thereby forming third openings OP3 on the bottom electrodes BE. According to an embodiment of the present invention, the width of the upper end of the third opening OP3 is relatively narrower than the width of its lower end (tapered from bottom to top).

As shown in FIG. 17 and FIG. 18, the third dielectric layer 130 is deposited into the third openings OP3, thereby forming air gaps 130a on the bottom electrodes BE and in the third dielectric layer 130 around the tapered upper portion TEU of each top electrode TE. According to an embodiment of the present invention, the air gap 130a is located around the tapered upper portion TEU of the top electrode TE and extends along the second direction D2. According to an embodiment of the present invention, the air gap 130a overlaps with the bottom electrode BE. According to an embodiment of the present invention, the third dielectric layer 130 covers and directly contacts the top electrode TE and the second dielectric layer 120. According to an embodiment of the present invention, the resistive-switching layer RS is disposed between the sidewall SW1 of the bottom electrode BE and the sidewall SW2 of the lower portion TEB of the top electrode TE, and between the third dielectric layer 130 and the sidewall SW3 of the tapered upper portion TEU of the top electrode TE.

Figure 19:
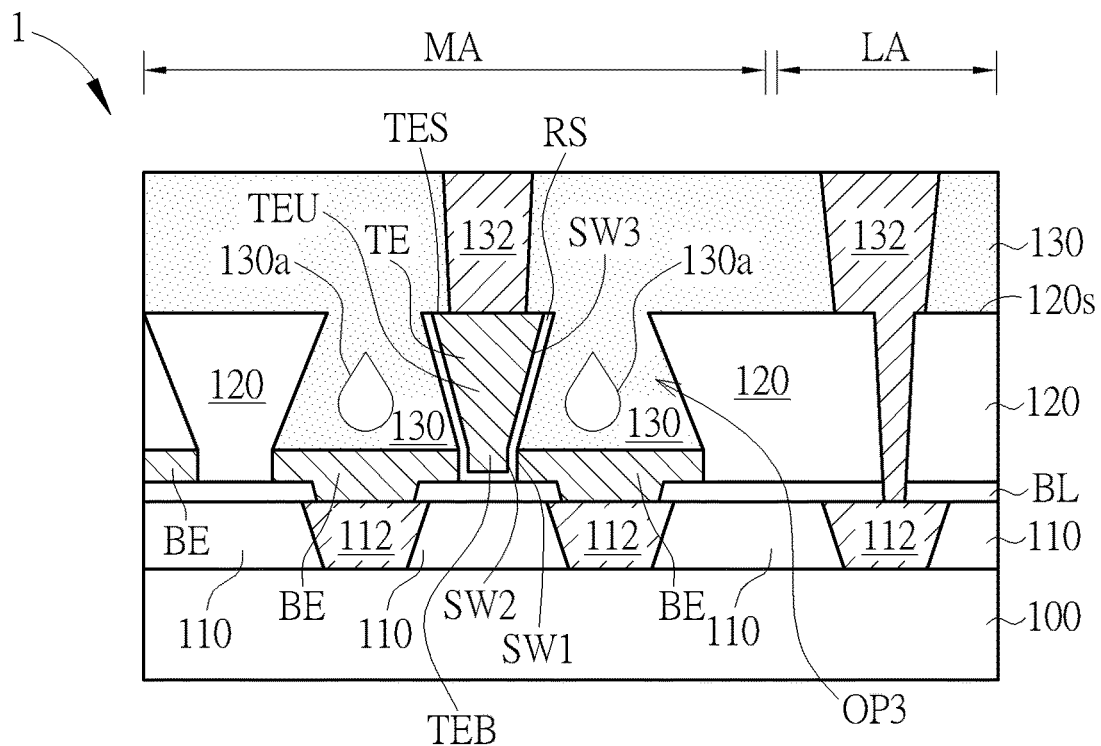

As shown in FIG. 19, a metallization process is performed to form a metal layer 132 in the third dielectric layer 130. The metal layer 132 is electrically connected to the top electrode TE. According to an embodiment of the present invention, the metal layer 132 may be a copper metal layer. For example, a copper damascene process may be used to form the metal layer 132, but it is not limited thereto.

Figure 20:
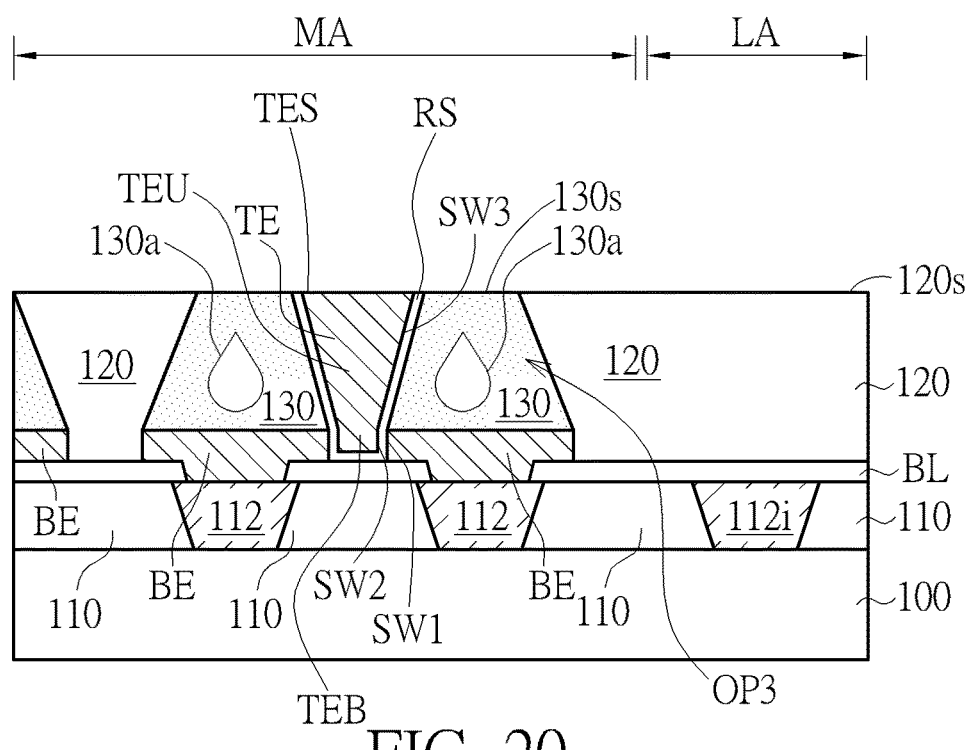
FIG. 20 and FIG. 21 illustrate another embodiment of the present invention.
Figure 21:
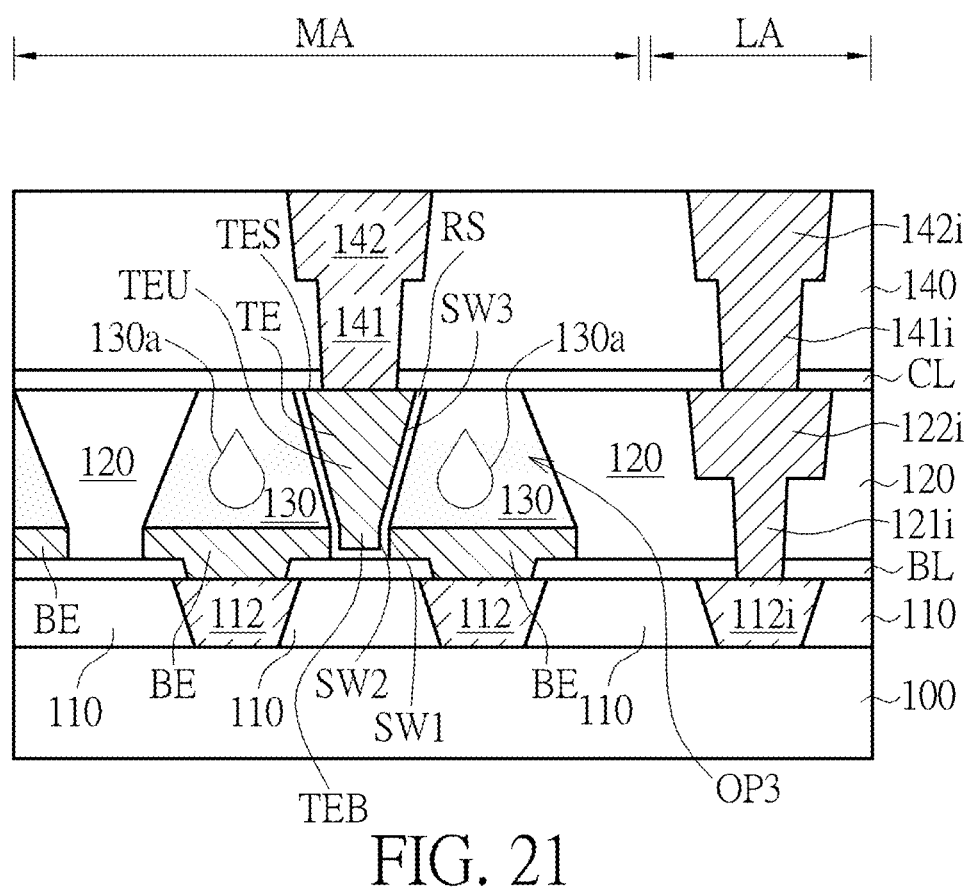

FIG. 20 and FIG. 21 illustrate another embodiment of the present invention. As shown in FIG. 20, following FIG. 18, after the third dielectric layer 130 is deposited in the third openings OP3 to form the air gaps 130a, the third dielectric layer 130 may be polished until the top surface 130s of the third dielectric layer 130 is flush with the top surface TES of the top electrode TE and the top surface 120s of the second dielectric layer 120. Subsequently, a metal layer 122i, such as a copper metal layer, may be formed in the second dielectric layer 120 in the logic circuit area LA. The metal layer 122*i* is electrically connected to the metal layer 112*i* in the first dielectric layer 110 through the conductive via 121*i*. As shown in FIG. 21, a capping layer CL is formed to cover the second dielectric layer 120, the top electrode TE, the third dielectric layer 130, and the metal layer 122*i*. A fourth dielectric layer 140 is then formed on the capping layer CL. A metal layer 142, for example, a copper metal layer, but is not limited to, may be formed in the fourth dielectric layer 140. According to an embodiment of the present invention, for example, the metal layer 142 may be the fourth metal layer (M4) in the metal interconnect structure, but is not limited thereto. A metal layer 142*i* and a conductive via 141*i* may be provided in the fourth dielectric layer 140 in the logic circuit area LA. The metal layer 142*i* is electrically connected to the metal layer 122*i* in the second dielectric layer 120 through the conductive via 141*i*.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a semiconductor memory device, comprising:
providing a substrate;
forming a first dielectric layer on the substrate;
depositing a first conductive layer on the first dielectric layer;
depositing a hard mask layer on the first conductive layer;
patterning the first conductive layer into a bottom electrode by forming a first opening in the hard mask layer and the first conductive layer;
depositing a second dielectric layer in the first opening and on the hard mask layer and the first dielectric layer;
polishing the second dielectric layer to expose a top surface of the hard mask layer;
patterning the second dielectric layer by etching the second dielectric layer, thereby forming a second opening in the second dielectric layer, wherein the second opening comprises a lower portion and a tapered upper portion;
depositing a resistive-switching layer in the second opening;
depositing a second conductive layer on the resistive-switching layer and in the second opening; and
polishing the second conductive layer and the resistive-switching layer until the top surface of the hard mask layer is exposed, thereby forming a top electrode in the second opening, wherein the top electrode comprises a lower portion around the bottom electrode and a tapered upper portion.

2. The method according to claim 1 further comprising:
removing the hard mask layer after polishing the second conductive layer and the resistive-switching layer, thereby forming a third opening on the bottom electrode; and
depositing a third dielectric layer into the third opening, thereby forming an air gap in the third dielectric layer on the bottom electrode and around the upper portion of the top electrode.

3. The method according to claim 2, wherein the third dielectric layer covers the top electrode and the second dielectric layer.

4. The method according to claim 3 further comprising:
forming a metal layer in the third dielectric layer, wherein the metal layer is electrically connected to the top electrode.

5. The method according to claim 2 further comprising:
polishing the third dielectric layer until a top surface of the third dielectric layer is coplanar with a top surface of the top electrode and a top surface of the second dielectric layer.

6. The method according to claim 5 further comprising:
forming a capping layer covering the second dielectric layer, the top electrode and the third dielectric layer;
forming a fourth dielectric layer on the capping layer; and
forming a conductive via in the fourth dielectric layer, wherein the conductive via is electrically connected to the top electrode.

7. The method according to claim 1, wherein the resistive-switching layer is disposed between a sidewall of the bottom electrode and a sidewall of the lower portion of the top electrode and between the third dielectric layer and a sidewall of the tapered upper portion of the top electrode.

8. The method according to claim 1 further comprising:
forming a dielectric block layer between the second dielectric layer and the first dielectric layer.

9. The method according to claim 8, wherein the top electrode is disposed on the dielectric block layer.

10. The method according to claim 1, wherein the resistive-switching layer $NiO_x$, $Ta_yO_x$, $TiO_x$, $HfO_x$, $WO_x$, $ZrO_x$, $Al_yO_x$, $SrTiO_x$, $Nb_yO_x$, or $Y_yO_x$, where x>0, y>0.

* * * * *